(12) United States Patent
Torashima et al.

(10) Patent No.: US 8,809,200 B2
(45) Date of Patent: Aug. 19, 2014

(54) METHOD OF MANUFACTURING A STRUCTURE BASED ON ANISOTROPIC ETCHING, AND SILICON SUBSTRATE WITH ETCHING MASK

(75) Inventors: Kazutoshi Torashima, Palo Alto, CA (US); Takahisa Kato, Tokyo (JP); Takahiro Akiyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1207 days.

(21) Appl. No.: 12/271,993

(22) Filed: Nov. 17, 2008

(65) Prior Publication Data

US 2009/0130857 A1 May 21, 2009

(30) Foreign Application Priority Data

Nov. 16, 2007 (JP) .................. 2007-298175

(51) Int. Cl.
 *H01L 21/302* (2006.01)
 *H01L 21/461* (2006.01)
 *B81C 1/00* (2006.01)
 *H01L 21/308* (2006.01)

(52) U.S. Cl.
 CPC .......... *B81C 1/0042* (2013.01); *H01L 21/3086* (2013.01); *B81C 1/00626* (2013.01)
 USPC ....................................................... 438/733

(58) Field of Classification Search
 CPC .............. B81C 1/0042; B81C 1/00626; H01L 21/3086; G02B 26/0833
 USPC ................... 438/733; 257/E21.023
 See application file for complete search history.

(56) References Cited

U.S. PATENT DOCUMENTS

| | | | |
|---|---|---|---|
| 3,765,969 A * | 10/1973 | Kragness et al. | ............. 438/753 |
| 6,924,914 B2 | 8/2005 | Kato et al. | |
| 7,057,783 B2 | 6/2006 | Kato et al. | |
| 7,173,747 B2 | 2/2007 | Yasuda et al. | |
| 7,277,214 B2 | 10/2007 | Yasuda et al. | |
| 7,362,488 B2 | 4/2008 | Yasuda et al. | |
| 2002/0113675 A1 | 8/2002 | Kato et al. | |
| 2002/0114053 A1 | 8/2002 | Yasuda et al. | |

FOREIGN PATENT DOCUMENTS

| | | |
|---|---|---|
| JP | 6-163511 A | 6/1994 |
| JP | 7-58345 A | 3/1995 |
| JP | 2002-321196 A | 11/2002 |

* cited by examiner

*Primary Examiner* — Duy Deo
*Assistant Examiner* — Mahmoud Dahimene
(74) *Attorney, Agent, or Firm* — Fitzpatrick, Cella, Harper & Scinto (57) ABSTRACT

A method of manufacturing a structure includes a first step of forming, on a monocrystal silicon substrate having a (100) surface as a principal surface, a basic etching mask corresponding to a target shape and having at least a first structure with a projecting corner and a second structure adjoining the first structure with an opening intervening therebetween, and a correction etching mask extending from the projecting corner of an etching mask of the first structure and connected to an etching mask of the second structure, and a second step of performing anisotropic etching of the monocrystal silicon substrate having the basic etching mask and the correction etching mask to form the target shape.

7 Claims, 9 Drawing Sheets

METHOD OF MANUFACTURING A STRUCTURE BASED ON ANISOTROPIC ETCHING, AND SILICON SUBSTRATE WITH ETCHING MASK

FIELD OF THE INVENTION AND RELATED ART

This invention relates to a method of manufacturing a structure based on anisotropic etching and to a silicon substrate with an etching mask.

Micromachine members, which are produced from a silicon substrate by a semiconductor process, have a machining precision of a micrometer order, and various micro-function devices are realized using these members. Particularly, optical deflectors based on such a technique can be made smaller in size and can have a lower power consumption than optical-scan optical systems using a rotary polygonal mirror, such as a polygon mirror.

An example of a conventional proposal is an optical deflector that can be made using anisotropic wet etching, which is one of the semiconductor processes (see U.S. Patent Application Publications Nos. 2002/0113675 and 2002/0114053). There is also a method using a correction etching mask (see Japanese Laid-Open Patent Application No. 6-163511 and Japanese Laid-Open Patent Application No. 7-58345), wherein a silicon substrate is etched based on an anisotropic wet etching technique to obtain a desired target shape (a shape corresponding to a basic etching mask).

SUMMARY OF THE INVENTION

When a target shape is made by using anisotropic wet etching of silicon, it is possible that, during the etching process or after the same, a correction etching mask, which adjoins the basic etching mask, comes off or is broken. If such damaged correction etching mask sticks to a target shape that is being formed, the final shape may differ from the desired target shape.

The present invention provides a method of manufacturing a structure based on anisotropic etching and a silicon substrate with an etching mask by which at least one of the inconveniences described above can be prevented or reduced.

In accordance with an aspect of the present invention, there is provided a method of manufacturing a structure, comprising a first step of forming, on a monocrystal silicon substrate having a (100) surface as a principal surface, a basic etching mask corresponding to a target shape and having at least a first structure with a projecting corner and a second structure adjoining the first structure with an opening intervening therebetween, and a correction etching mask extending from the projecting corner of an etching mask of the first structure and connected to an etching mask of the second structure, and a second step of anisotropically etching the monocrystal silicon substrate having the basic etching mask and the correction etching mask to form the target shape.

In one preferred form of this aspect of the present invention, the second step includes a step of removing a portion of the monocrystal silicon substrate where the correction etching mask is formed.

The correction etching mask may have a bent portion.

The correction etching mask may have at least a shape extending in a [110] direction.

The correction etching mask may have at least a shape extending in a [100] direction.

The correction etching mask may have a Y-letter shape extending from the projecting corner of the first structure in a [110] direction and branched off in a [100] direction, the branches of the correction etching mask being connected to the etching mask of the second structure.

The correction etching mask may have a recess having a curvature.

In accordance with another aspect of the present invention, there is provided a silicon substrate with an etching mask, comprising a basic etching mask corresponding to a target shape and having at least a first structure with a projecting corner and a second structure adjoining the first structure with an opening intervening therebetween; and a correction etching mask extending from the projecting corner of an etching mask of the first structure and connected to an etching mask of the second structure.

In accordance with a further aspect of the present invention, there is provided an oscillator device, which comprises a supporting member, a movable member supported for motion relative to the supporting member, a resilient supporting member for supporting the supporting member and the movable member resiliently around a torsion axis, and driving means for driving the movable member, the oscillator device being manufactured in accordance with a structure manufacturing method as recited above.

In accordance with a still further aspect of the present invention, there is provided an optical deflector, which comprises an oscillator device mentioned above and an optical deflecting element provided on the movable member of the oscillator device.

In accordance with a yet further aspect of the present invention, there is provided an optical instrument, such as, for example, an image forming apparatus, which comprises an optical deflector mentioned above and which is configured to deflectively reflect a light beam from a light source and to make at least a portion of the light beam incident on an object to be irradiated by the light beam, such as, for example, a photosensitive member.

In accordance with the present invention, since a correction etching mask as described above is used, the possibility of peeling or breaking the correction etching mask that adjoins the basic etching mask decreases. Therefore, the possibility that the final shape differs from the desired target shape is reduced, and thus, the deficient product rate is decreased.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Some preferred forms of the present invention are described below in conjunction with the drawings.

In the microstructure manufacturing method of the present invention based on anisotropic etching or in the monocrystal silicon substrate of the present invention having a (100) surface as a principal surface on which an etching mask is formed, the following requirements must be satisfied.

First, etching masks mentioned below should be formed on a monocrystal silicon substrate having a (100) surface as a principal surface. Specifically, these masks include a basic etching mask corresponding to the target shape and having at least a first structure with a projecting corner and a second structure juxtaposed to the first structure with an opening intervening therebetween and a correction etching mask, which extends from the projecting corner of the etching mask of the first structure and connects with the etching mask of the second structure.

Then, the monocrystal silicon substrate having the basic etching mask and the correction etching mask is processed by anisotropic etching, whereby a target shape is formed. In that process, a portion of the partial monocrystal silicon substrate where the correction etching mask is formed is removed by the etching.

The correction etching mask may have a shape with a bent portion. Furthermore, the correction etching mask may have a shape including at least a portion extending in the [110] direction. Furthermore, the correction etching mask may have a shape including at least a portion extending in the [100] direction.

Figure 2A:
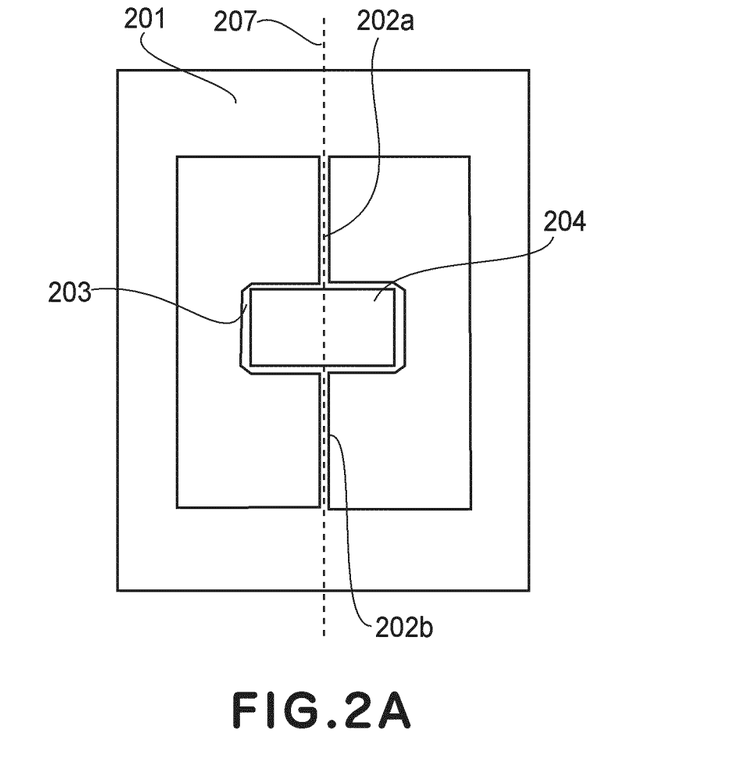
FIG. 2A is a top plan view of a micro-oscillator or an optical deflector according to the first embodiment of the present invention, which is made based on the microstructure manufacturing method of the present invention.
Figure 2B:
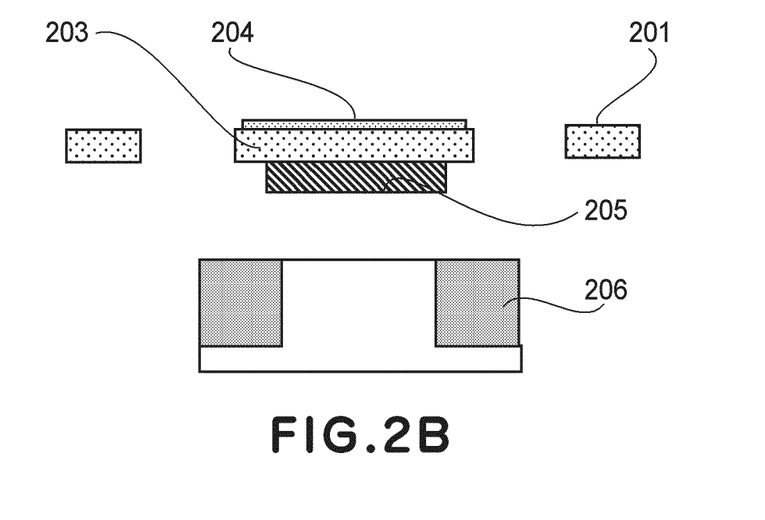
FIG. 2B is a cross-sectional view of FIG. 2A.

It should be noted that although in the present embodiment the first structure having a projecting corner comprises a movable member 203 shown in FIG. 2 and the second structure juxtaposed to the first structure with an opening intervening therebetween comprises a supporting member 201 shown in FIG. 2, the present invention is not limited to this arrangement. Namely, the present invention is applicable to any microstructure, provided that it includes at least a first structure having a projecting corner and a second structure juxtaposed to the first structure with an opening intervening therebetween. For example, the invention is applicable to a microstructure, such as an acceleration sensor or an angular velocity sensor to be made using the micromachining technique.

Figure 1A:
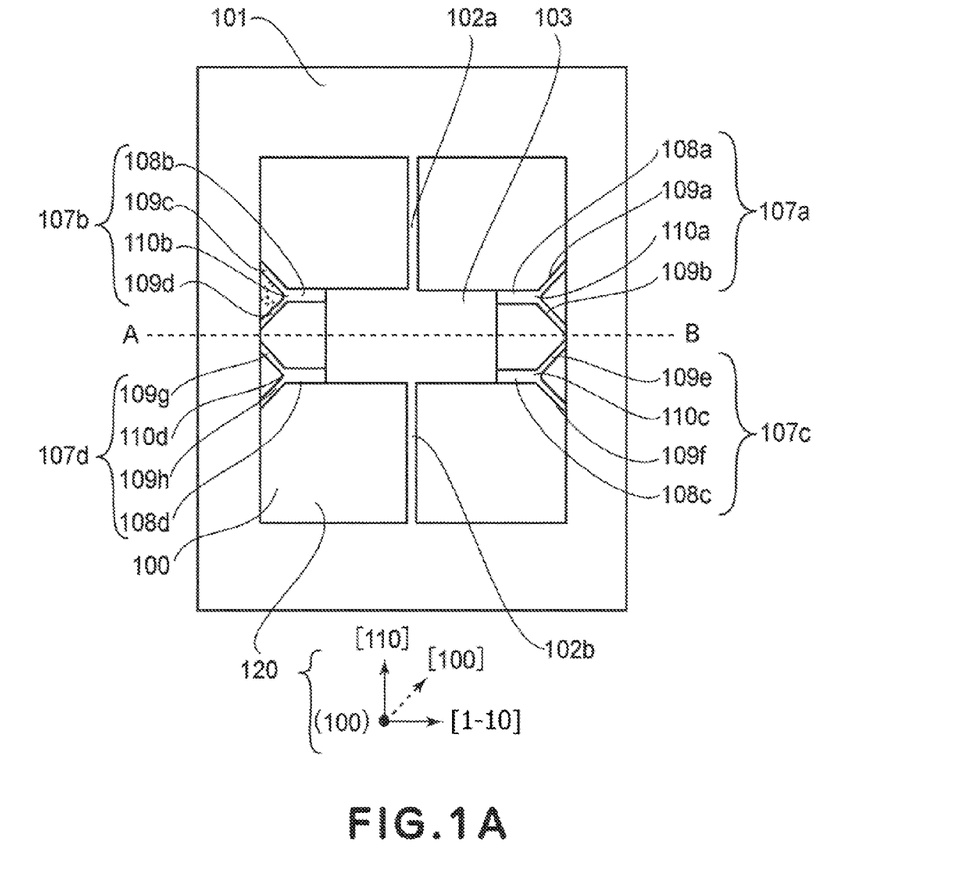
FIG. 1A is a top plan view for explaining an etching mask according to a preferred form of the present invention and a first embodiment thereof.
Figure 1B:
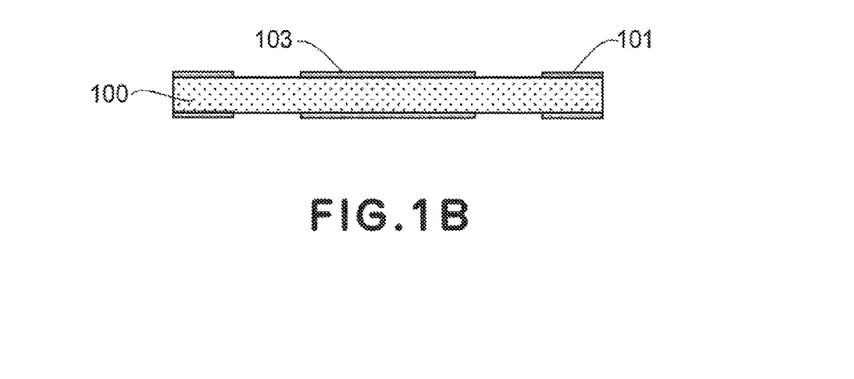
FIG. 1B is a cross-sectional view along line A-B in FIG. 1A.

FIG. 1A is a top plan view illustrating an etching mask for a structure, such as a microstructure, in one preferred form of the present invention. FIG. 1B is an A-B cross-sectional view of FIG. 1A. FIG. 2A is a top plan view illustrating a structure, such as a microstructure to be manufactured by etching a monocrystal silicon substrate using an anisotropic etching solution. FIG. 2B is a cross-sectional view of the same. Furthermore, FIG. 3 is an enlarged top view of a portion of a correction etching mask in this preferred form of the present embodiment. It is a diagram for explaining how the monocrystal silicon substrate underneath the correction etching mask is etched by the anisotropic etching solution.

In the microstructure manufacturing method of this preferred form of the present invention, a micro-oscillator, which comprises, as shown in FIG. 2A, a supporting member 201 (second structure), resilient supporting members 202a and 202b, and a movable member 203 (first structure) configured to oscillate around a torsion axis 207, is the target shape. This microstructure may further comprise a reflection surface 204, as well as a magnetic material 205 and an electric coil 206, as shown in FIG. 2B. Thus, the microstructure can be used as an optical deflector for deflectively reflecting an incident light beam by the reflection surface 204. Although the applicability of the present embodiment is not limited to such microstructures, the following description is based thereon.

In the microstructure manufacturing method of this preferred form of the present invention, the target shape is formed by performing anisotropic wet etching of a monocrystal silicon substrate having a (100) surface as a principal surface. The anisotropic wet etching is an etching process, which uses an etchant having such property that the etching does not progress with respect to a predetermined crystal orientation. With this procedure, a microstructure in which a predetermined crystal plane functions as a reference, that is, a structure that is defined by using such a crystal plane, can be made with a very high finishing precision. Examples of anisotropic etchants are KOH (potassium hydroxide), TMAH (tetramethyl ammonium hydroxide water solution), EDP (ethylenediamine pyrocatechol+water), NaOH (sodium hydroxide), hydrazine, and so on.

When a monocrystal silicon substrate is etched with an anisotropic etching solution, in order to assure that the silicon substrate is etched into a shape exactly corresponding to the target shape, in addition to a basic etching mask corresponding to the target shape, a correction etching mask is used to protect a projecting corner of the target shape. More specifically, the correction etching mask is used to prevent the projecting corner of the target shape from being etched while the silicon substrate is processed by etching into the target shape. For this reason, the end portion of the correction etching mask to be connected to the projecting corner is connected to the projecting corner in such a manner that the shape of the projecting corner disappears. In the embodiment shown in FIG. 2A, the basic etching mask comprises a supporting member 201, resilient supporting members 202a and 202b, and portions 101, 102a, 102b, and 103 corresponding to a movable member 203. Hereinafter, these mask portions will be referred to also as "supporting member 101 and the like".

The correction etching mask comprises portions 107a, 107b, 107c, and 107d. Hereinafter, these mask portions will be referred to also as "correction etching mask 107a and the like".

In this manner, until the supporting member 201, resilient supporting members 202a and 202b, and movable member 203, shown in FIG. 2A, are made, the correction etching masks 107a, 107b, 107c, and 107d of FIG. 1A function to prevent the projecting corner of the movable member 203 from being etched.

The microstructure manufacturing method in this preferred form of the present invention will be explained.

A mask material is layered on both surfaces of the monocrystal silicon substrate 100 having a (100) surface as a principal surface.

The mask material can be any material provided that it is not removed while the silicon substrate is etched by the anisotropic etching solution. For example, a silicon nitride film, a silicon oxide film, or the like may be used.

Based on the photolithography and patterning of the mask material, a mask pattern, such as shown in FIGS. 1A and 1B, can be formed. After the mask pattern formation, the silicon substrate 100 is dipped into the anisotropic etching solution, whereby a final shape, such as shown in FIG. 2A, can be formed. During this process, if the side surface of the silicon substrate 100 is exposed to the etching solution, a masking material may be deposited on the side surface beforehand.

Figure 10A:
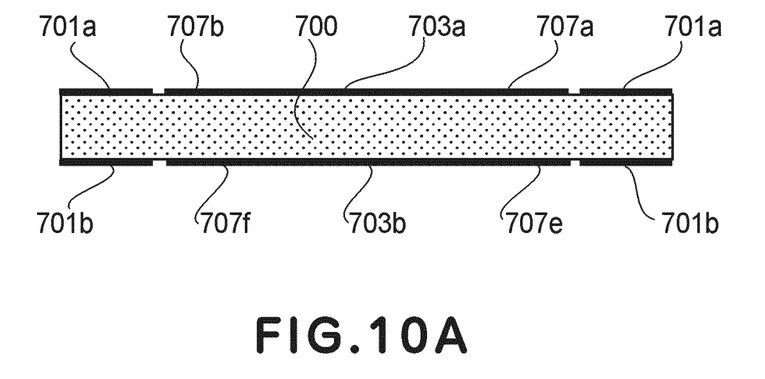
FIGS. 10A-10C are cross-sectional views along line A-B in FIG. 8 for explaining a comparative example.
Figure 10B:
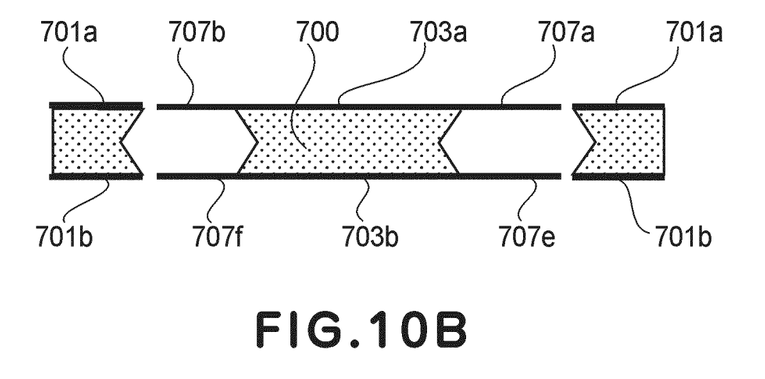
Figure 10C:
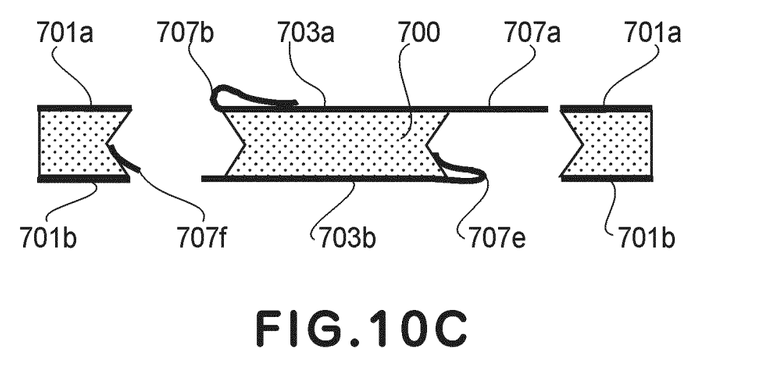

It is to be noted that the etching may be carried out while the mask pattern is formed only on a single surface of the monocrystal silicon substrate 100 and the other surface is covered by a masking material. However, in that case, the etching action differs from that shown in FIG. 10. Furthermore, a plurality of microstructures may be manufactured by juxtaposing them on a single piece of a silicon substrate. In that case, since the microstructures are adjoining, a masking material should be layered on the side surface of the silicon substrate.

In the microstructure manufacturing method in this preferred form of the present invention, the correction etching masks 107a, 107b, 107c and 107d are connected to the movable member 103 and supporting member 101, which are a basic etching mask. Among them, the correction etching masks with portions 108a, 108b, 108c, and 108d have an end portion connected to a projecting corner of the basic etching mask 103 of the movable member, and these have a rectangular shape extending in the [110] direction. The other ends of the correction etching masks with portions 108a, 108b, 108c, and 108d provide bent portions 110a, 110b, 110c, and 110d, which are connected to the correction etching mask portions 109a, 109b, 109c, 109d, 109e, 109f, 109g, and 109h. The correction etching mask portions 109a, 109b, 109c, 109d, 109e, 109f, 109g, and 109h extend in the [100] direction and are connected to the basic etching mask 101 of the supporting member.

In the microstructure manufacturing method in this preferred form of the present invention, the correction etching mask should have bent portions or branched portions. These should not necessarily be an etching mask extending from the bent portion in the [100] direction. For example, it may be one extending between the [100] direction and the [110] direction. It is to be noted that, with regard to the crystal orientation 120, the equivalent azimuth and the equivalent surface of crystal are expressed in the same way. For example, the [001] direction may be expressed as a [100] direction.

As described above, each of the correction etching masks 107a, 107b, 107c and 107d extends throughout the opening of the target shape and has a plurality of end portions (three, in this embodiment), wherein at least two of the end portions are connected to the basic etching mask at the opposite sides across the opening. Then, one end of each correction etching mask is connected to the projecting corner of the basic etching mask.

The function and effect of the correction etching mask in the microstructure manufacturing method in this preferred form of the present invention, will be explained.

FIGS. 3A-3D are enlarged diagrams showing the etching process at a correction etching mask 107a of FIG. 1. The components corresponding to the ones shown in FIG. 1 are denoted by numerals in the 300s.

Figure 3A:
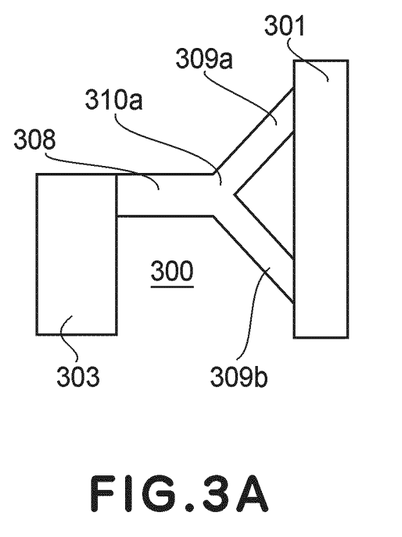
FIG. 3A is a top plan view for explaining a portion of a correction etching mask in the first embodiment of the present invention.

As shown in FIG. 3A, a basic etching mask 303 of the movable member and a basic etching mask 301 of the supporting member are formed on a monocrystal silicon substrate 300 having a (100) surface as a principal surface. Furthermore, correction etching mask portions 308, 309a, and 309b are formed to connect the movable member 303 and the supporting member 301 together.

Figure 3B:
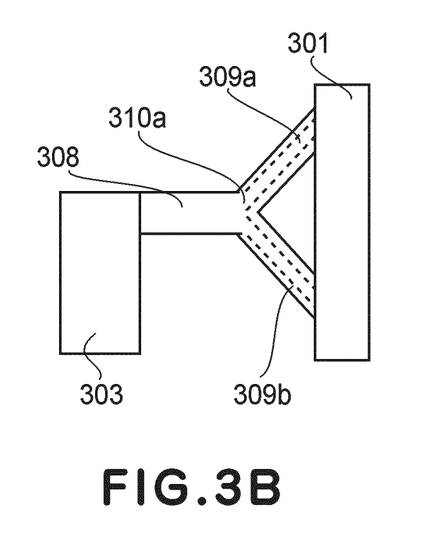
FIG. 3B is a top plan view for explaining an initial stage of the etching process in a portion of the correction etching mask.
Figure 3C:
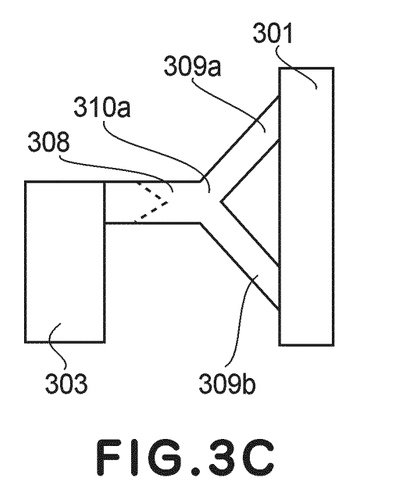
FIG. 3C is a top plan view for explaining a middle stage of the etching process in a portion of the correction etching mask.
Figure 3D:
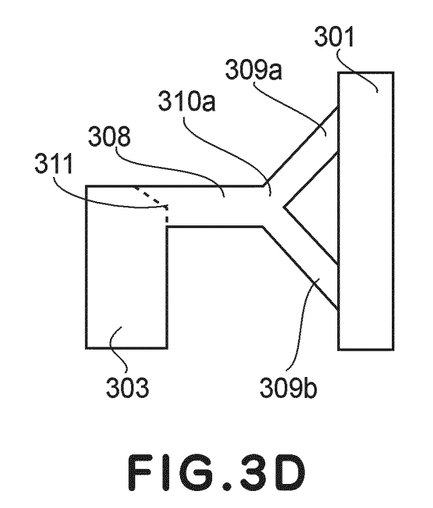
FIG. 3D is a top plan view for explaining a final stage of the etching process in a portion of the correction etching mask.

As shown in FIG. 3B, when the silicon substrate 300 is dipped into the anisotropy wet etching solution, the etching progresses in the [100] direction perpendicular to the depicted plane of the drawing, and, additionally, mainly the silicon portions underneath the correction etching mask portions 309a and 309b are etched (as depicted by a broken line). When the etching progresses furthermore, as shown in FIG. 3C, the silicon substrate underneath the mask portions 309a and 309b is removed by etching, and the silicon portion underneath the correction etching mask 308 is etched (as depicted by a broken line). Finally, as shown in FIG. 3D, the silicon portion underneath the basic etching mask 303 of the movable member is left, whereby a final shape is produced.

In this final shape, side etching progresses while the silicon underneath the correction etching mask is completely etched. Thus, the projecting corner is slightly etched and a side etching portion 311 depicted by a broken line in FIG. 3D is formed. Since the correction etching mask is connected to the basic etching mask, even when the final shape is made and the silicon underneath the correction etching masking is removed, the opposite end portions of the correction etching mask are still connected to the basic etching mask.

Figure 8:
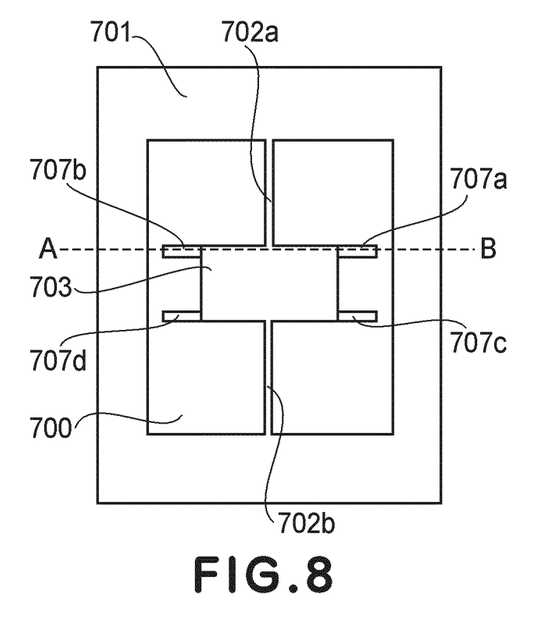
FIG. 8 is a top plan view of an etching mask for explaining a comparative example.

As a comparative example, an etching mask shown in FIG. 8 is used to make a final shape of the microstructure.

The correction etching masks 707a, 707b, 707c and 707d shown in FIG. 8 have an end portion connected to a projecting corner of the basic etching mask 703. The other end portions of the correction etching masks 707a, 707b, 707c and 707d are not connected.

FIGS. 9A-9D are enlarged views of the correction etching mask of FIG. 8. In FIG. 8, those portions corresponding to the components shown in FIG. 1 are denoted by numerals in the 700s.

Figure 9A:
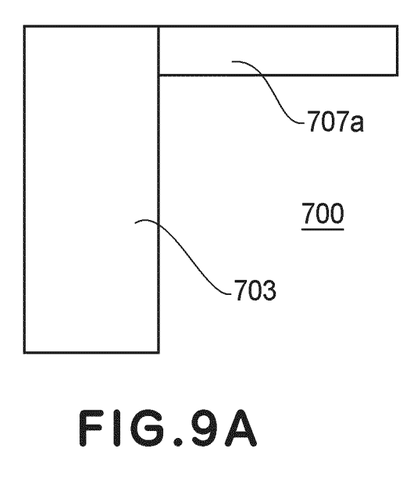
FIGS. 9A-9D are top plan views illustrating the etching process at a portion of a correction etching mask in a comparative example.
Figure 9B:
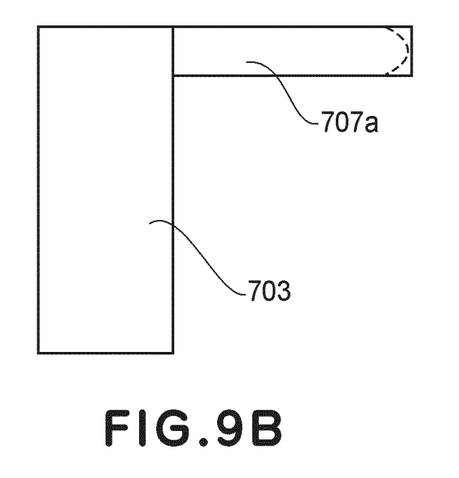
Figure 9C:
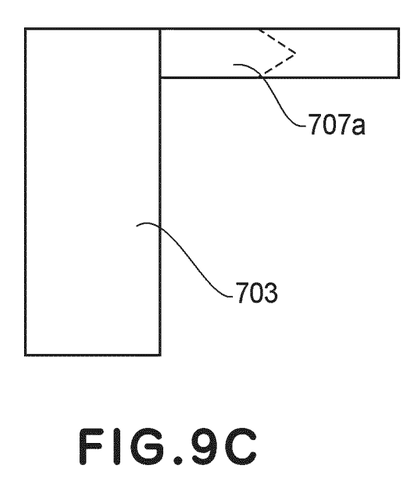
Figure 9D:
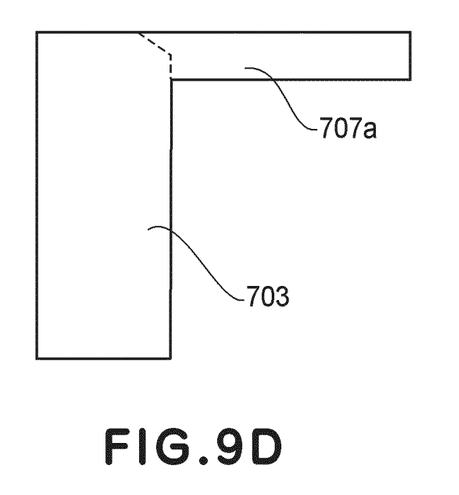

In this manner, in the comparative example, as shown in FIG. 9A, a basic etching mask 703 of the movable member and a correction etching mask 707a are formed on the monocrystal silicon substrate having a (100) surface as a principal surface. Although one end of the correction etching mask 707a is connected to the projecting corner of the basic etching mask 703, the other end is not connected to the basic etching mask. As shown in FIGS. 9B and 9C, when the silicon substrate 700 is dipped into the anisotropic wet etching solution, the etching progresses in the [100] direction perpendicular to the plane of the drawing, and, in addition to this, the silicon portion underneath the correction etching mask 707a is etched (as depicted by a broken line). Finally, as shown in FIG. 9D, the silicon portion underneath the basic etching mask 703 of the movable member is left, whereby a final shape is produced.

FIGS. 10A-10C are A-B cross-sectional views of FIG. 8. FIG. 10A is a cross-sectional view of the silicon substrate 700 as an etching mask is formed thereon. FIG. 10B is a cross-sectional view of the silicon substrate 700 as the etching is completed. In this comparative example, as shown in FIG. 10B, at the time etching is completed, the silicon portions underneath the correction etching masks 707a, 707b, 707e, and 707f have been etched, such that at these portions the correction etching mask is supported at one side. Thus, the correction etching mask can be quite easily broken. Furthermore, with regard to the correction etching mask, the silicon material underneath it has been etched and there is no silicon substrate. Additionally, the thickness of the correction etching mask is of a submicron order. Thus, the correction etching mask is very thin and can be quite easily broken. Still further, since there is a residual stress in the masking material caused at the time of the film formation, after the etching of the silicon substrate, the correction etching mask can be deformed easily by the stress. Here, in FIGS. 10A-10C, reference numerals 701a, 701b, 703a, and 703b denote basic etching masks at the top and bottom surfaces of the silicon substrate 700.

For the reasons described above, as shown in FIG. 9C, the correction etching masks 707a, 707b, 707e, and 707f may break in the course of the etching process. If a broken mask sticks to the silicon portion to be etched, such portion will no longer be etched. Furthermore, if it sticks to any other etching mask, the thickness of the portion where the broken mask is adhered will be doubled. If this occurs, in a subsequent step of separating the etching mask, the masking material will remain or, alternatively, a twofold separation process time will be required. If the separation time is prolonged, it is possible that a part of the silicon portion will also be removed. Thus, it becomes difficult to obtain a final shape exactly corresponding to the desired target shape.

In the microstructure manufacturing method in this preferred form of the present invention, as compared therewith, each correction etching mask is connected to a basic etching mask and, therefore, it is hard to break. Thus, the correction etching mask after the final shape is made is quite strong, and the possibility of breaking the correction etching mask is reduced. In this manner, the deficient product rate for that the microstructure has a different shape from the target shape is reduced.

Furthermore, in the microstructure manufacturing method in this preferred form of the present invention, the correction etching mask has at least one bent portion and a rectangular portion extending in the [110] directions.

If, for example, the correction etching mask has no bent portion and it is formed only by a rectangular shape extending in the [100] direction, the time period in which the silicon underneath the correction etching mask is etched is dependent on the width of the correction etching mask. Thus, if the time (etching time) for processing the silicon into the final shape is long, the width of the correction etching mask must be made large. However, a correction etching mask having a large width is difficult to apply when the basic etching mask (target shape) is small. Furthermore, if the width of the correction etching mask is large and its length is short, it is possible that the (111) surface having a very slow etching rate is exposed during the etching process and the etching process does not progress further. Alternatively, etching becomes unstable. Thus, in order to process the silicon into the target shape, the length of the correction etching mask also has to be long. This leads to a decrease in the number of microstructures with a final shape that can be made from one piece of a silicon wafer, increasing the cost. Furthermore, it is possible that the silicon underneath the correction etching mask will remain without being completely etched. Since, however, depending on the target shape, a correction etching mask, which is shaped only by a rectangle extending in the [100] direction from the projecting corner of the basic etching mask and which is hard to break, can be used, the present invention does not exclude such a form.

If the correction etching mask has no bent portion and is formed only by a rectangle extending in the [110] direction, it is possible that the (111) surface having a very slow etching rate is exposed and the silicon underneath the correction etching mask is not etched further. Thus, with this mask, it is very difficult to process the silicon into the final shape. It does not function as a correction etching mask.

Only in the case where a correction etching mask, which extends in the [110] direction, is formed on both surfaces of the silicon wafer and the silicon wafer is etched from both surfaces thereof, the silicon underneath the correction etching mask may be etched. However, even in this case, a variety of crystal planes would be exposed during the etching process. Therefore, the etching process can be very unstable. Furthermore, since the time period during which the correction etching mask functions as a mask cannot be considerably increased, if the etching time is long, it is possible that the mask would not function as a correction etching mask. Therefore, such a form is not preferable. Since, however, it is possible that, if the extending direction is even slightly tilted from the [110] direction, the mask may be used as a correction etching mask. Therefore, depending on the situation, a correction etching mask of such form that is difficult to break can be used, and the present invention does not exclude such a form.

In the microstructure manufacturing method in this preferred form of the present invention, as described above, the correction etching mask has at least one bent portion or branched portion, and it has a rectangular portion extending in the [110] direction. Thus, the silicon underneath the correction etching mask at its free end portion is etched from the bent portion other than the rectangular shaped portion extending in the [110] direction. Afterwards, the rectangular portion extending in the [110] direction is etched, whereby a target shape is realized.

More specifically, in the microstructure manufacturing method in this preferred form of the present invention, the opposite end portions of the correction etching mask are connected to the basic etching mask, so that the silicon substrate can be processed into a target shape. Additionally, the deficient product rate of the microstructure can be reduced. Therefore, the manufacturing cost of microstructures can be significantly decreased. Furthermore, since the correction etching mask can be small, the silicon substrate can be processed into a very small final shape. Also, the number of microstructures, which can be made from one piece of wafer, can be increased.

Furthermore, this preferred form of the present invention concerns a method of manufacturing a microstructure, which comprises a correction etching mask having an end portion formed with a shape extending in the [100] direction and being connected to a basic etching mask. In the microstructure manufacturing method in this preferred form of the present invention, as shown in FIGS. 3B-3D, the etching starts from the portion that is ahead of the bent portion of the rectangular portion extending in the [110] direction. If this portion extends in the [100] direction, then the [100] direction becomes the etching direction and, as a result, the time during which the mask can function as a correction etching mask is determined only by the width.

If this portion extends in a different direction (between the [100] direction and [110] direction), a variety of crystal surfaces will easily appear during the etching process. Thus, stable etching is difficult to achieve and the etching time easily becomes unstable.

With the microstructure manufacturing method in this preferred form of the present invention, stable etching is assured. Furthermore, by making larger the width of the rectangular portion extending in the [100] direction and by making shorter the length of the rectangular portion extending in the [110] direction, the size of the correction etching mask can be made smaller.

Furthermore, the correction etching mask may have a Y-letter shape, which extends from a projecting corner of the mask 103 of the first structure (movable member) in the [110] direction and which is branched in the [100] direction, each of the branched correction etching masks being connected to the mask 101 of the second structure (supporting member). Namely, the microstructure manufacturing method may be such that the correction etching mask has at least three end portions, all of which are connected to a basic etching mask. In the microstructure manufacturing method in this preferred form of the present invention, as shown in FIG. 1A, the correction etching mask is formed with a Y-letter shape having three end portions, and all of these end portions are connected to a basic etching mask. With such a microstructure manufacturing method using this basic etching mask, separation of the correction etching mask or breakage of the same during or after the etching process can be more assuredly prevented. Therefore, the deficient product rate of microstructures can be further reduced.

It is to be noted that, if, for example, a further bent portion is provided and the correction etching mask has four or more end portions, as depicted in FIG. 1A, the correction etching mask would be more hardly damaged.

Furthermore, the microstructure manufacturing method may be such that the correction etching mask has a recess having a curvature (i.e., roundness). With such a manufacturing method, the stress concentration to the recess of the correction etching mask is reduced. Therefore, breakage of the correction etching mask can be more assuredly prevent.

Furthermore, the microstructure manufacturing method may be such that a basic etching mask and a correction etching mask are formed on both surfaces of a monocrystal silicon substrate. With such a manufacturing method, microstructures of the same shape can be produced on the both surfaces of the silicon substrate. Since there are correction etching masks on both surfaces, the possibility of breakage of the correction etching mask may increase to some extent. However, the deficient product rate can be reduced as compared with the conventional method.

Furthermore, with the microstructure manufacturing method in this preferred form of the present invention, a micro-oscillator, which comprises a supporting member, a movable member, a resilient supporting member for coupling the supporting member and the movable member resiliently around a torsion axis, and driving means for driving the movable member, can be manufactured. A magnetic material 205 and an electric coil 206, such as shown in FIG. 2B, may constitute the driving means. Since the deficient product rate of micro-oscillators to be made by this manufacture method can be decreased, the micro-oscillators can be produced relatively inexpensively.

Furthermore, an optical deflecting element may be provided on the movable member of the aforementioned micro-oscillator to produce an optical deflector. The optical deflector may deflectively reflect an incident light beam with its reflection surface 204, as shown in FIG. 2B. Since the deficient product rate can be decreased in this case as well, the optical deflector can be produced inexpensively.

Furthermore, the present invention can be used to manufacture optical instruments, such as an image forming apparatus, which comprises a light source, an optical deflector, such as mentioned above, and an object to be irradiated with light such as a photosensitive member, wherein the optical deflector deflects the light from the light source so that at least a portion of the light is incident on the object to be irradiated, such as the photosensitive member. Here, since an inexpensive optical deflector is used, the optical instrument can be provided relatively inexpensively.

Next, some specific embodiments of the present invention will be explained with reference to the drawings.

Embodiment 1

Referring to FIGS. 1A, 1B, 2A, and 2B, the structure of an optical deflector of the first embodiment, as well as a driving method and a manufacturing method of the same, will be explained.

FIG. 1A is a top plan view illustrating an etching mask for the optical deflector of the present embodiment, and FIG. 1B is a cross-sectional view taken along line A-B of FIG. 1A. FIGS. 2A and 2B are diagrams for explaining the optical deflector, which is made by etching a monocrystal silicon substrate having a (100) surface as a principal surface using an anisotropic etching solution.

As shown in FIGS. 2A and 2B, the optical deflector of the present embodiment comprises a supporting member 201, a movable member 203, and resilient supporting members 202a and 202b. The resilient supporting members 202a and 202b function to connect the movable member 203 to the supporting member 201 resiliently around the torsion axis 207. A reflection surface 204 is formed on the movable member 203. In this embodiment, the material of the reflection surface 204 is aluminum, and it is formed by vacuum deposition. However, the reflection surface 204 may be made of another material, such as, for example, gold or copper, and a protection film or a dielectric multilayer may be formed furthermore. For example, the movable member 203 may have a length of 1.3 mm in a direction perpendicular to the torsion axis 207, a length of 1.5 mm in a direction parallel to the torsion axis 207, and a thickness of 0.2 mm. The chip full length of the optical deflector, for example, may be 10 mm.

The driving principle of the optical deflector of the present embodiment will be explained below.

As shown in FIG. 2B, the movable member 203 has a hard magnetic material 205, which is magnetized in a direction perpendicular to the torsion axis 207. The electric current to be applied to the electric coil 206 is an alternating current, and a magnetic field depending on the frequency of the alternating current is produced. This magnetic field applies a force to the hard magnetic material 205 of the movable member 203. In this way, a torque is applied to the movable member 203, such that the optical deflector can be driven by torsional oscillation. Furthermore, by applying an alternating current that is the same as the resonance frequency of the optical deflector of the present embodiment to the electric coil 206, torsional oscillation can be produced at a low power consumption.

The manufacturing method of the present embodiment will be explained with reference to FIGS. 1A and 1B. A silicon nitride film is layered on both surfaces of the monocrystal silicon substrate 100 having a (100) surface as a principal surface, with a thickness of about 2000 angstroms based on the LPCVD (Low Pressure CVD) method. Since the silicon nitride film has high resistance to a potassium hydroxide solution, it is not removed when the silicon substrate 100 is etched with the anisotropic etching solution.

Subsequently, both surfaces of the monocrystal silicon substrate 100 are patterned by photolithography to provide an etching mask pattern, such as shown in FIG. 1. Afterwards, the patterned silicon monocrystal substrate 100 is etched by using a potassium hydroxide solution (30% weight density), which is an anisotropic etching solution, heated to 110 degrees Celsius. After the etching is completed, the silicon nitride film, which is an etching mask, is separated by dry etching. Finally, by layering aluminum, which provides a reflection surface, the final shape such as shown in FIG. 2A is formed.

In the microstructure manufacturing method of the present embodiment, the correction etching masks 107a, 107b, 107c, and 107d are connected to the movable member 103 and the supporting member 101, which are a basic etching mask. An end portion of each of the correction etching mask portions 108a, 108b, 108c, and 108d is connected to an projecting corner of the basic etching mask 103 of the movable member, and this portion has a rectangular shape extending in the [110] direction. Furthermore, the portions 109a, 109b, 109c, 109d, 109e, 109f, 109g, and 109h, which are branched from the bent portions 110a, 110b, 110c, and 110d of the correction etching masks, are connected to the basic etching mask 101 of the supporting member. Thus, the movable member 103 and the supporting member 101, which are a basic etching mask, are located at the opposite sides of the opening that defines the projecting corner of the movable member 103, and the correction etching mask serves as a bridge therebetween.

The etching process of the present embodiment is just like the one described with reference to the preferred form of the present invention in conjunction with FIG. 3.

Since the correction etching mask has a pattern as described above, the following advantageous effects are provided by the present embodiment.

If the correction etching mask is broken during the etching process and it sticks to the resilient supporting members 202a and 202b, which are being formed, the shape of the resilient supporting members will deteriorate and, as a result, the resilient supporting members will be easily broken. If the correction etching mask sticks to the movable member 203, which is being formed, a surface step is created at the reflection surface, causing a deterioration of the optical characteristics of the optical deflector.

In this embodiment, all end portions (three in this embodiment) of the correction etching mask of a Y-letter shape bridging the aforementioned opening of the etching mask are connected to the basic etching mask. Therefore, during the etching process or in the cleaning step after the etching process, breakage of the correction etching mask can be assuredly reduced. Thus, a yield of 90% or more can be expected.

Embodiment 2

A microstructure manufacturing method according to a second embodiment of the present invention will be explained with reference to FIG. 4.

Figure 4:
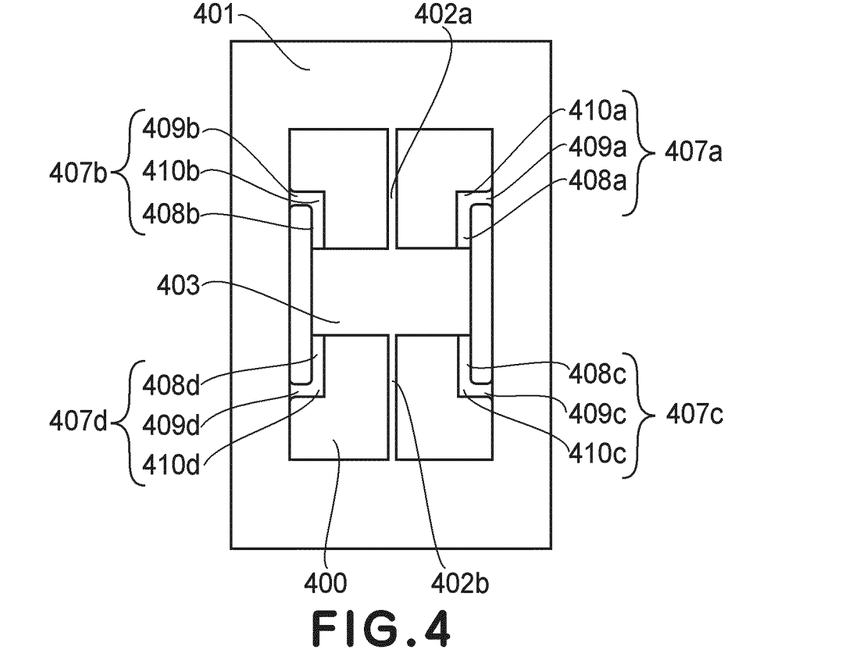
FIG. 4 is a top plan view for explaining an etching mask according to a second embodiment of the present invention.

FIG. 4 is a top plan view, which shows an etching mask of a microstructure in the present embodiment. The micro-oscillator of the second embodiment has a generally similar structure to that of the optical deflector of the first embodiment. One of the features of the microstructure manufacturing method of the present embodiment is that the recess in the correction etching mask is curved.

In the microstructure manufacturing method of the present embodiment, the correction etching masks 407a, 407b, 407c, and 407d having a hook-like shape are connected to the movable member 403 and the supporting member 401, which are a basic etching mask. The basic etching mask comprises a portion 401 corresponding to the supporting member, a portion 403 corresponding to the movable member, and portions 402a and 402b corresponding to the resilient supporting members.

The correction etching mask portions 408a, 408b, 408c and 408d are connected to projecting corners of the basic etching mask 403 of the movable member, respectively and have a rectangular shape extending in the [110] direction. Furthermore, the correction etching mask portions 409a, 409b, 409c, and 409d are connected to the basic etching mask 401 of the supporting member. These end portions of the correction etching mask have a shape extending in the [110] direction and are connected to the basic etching mask 401 corresponding to the projecting corners. Furthermore, the recess of the correction etching mask is formed with a curvature radius (R) of 100 μm.

The etching process in the present embodiment is as follows. When the silicon substrate 400 is dipped in an anisotropic wet etching solution, the etching progresses in the [100] direction perpendicular to the plane of the drawing. Also, the etching progresses from the projecting corners of the bent portions 410a, 410b, 410c, and 410d of the correction etching masks. When the etching progresses further, the silicon substrate underneath the correction etching masks 407a, 407b, 407c, and 407d is etched. Finally, the silicon portions underneath the basic etching masks are left, whereby the final shape is produced. In this final shape, side etching progresses while the silicon underneath the correction etching mask is completely etched, such that the projecting corner of the movable member 403 is slightly etched and a side etching portion is formed. Here, since both end portions of each correction etching mask are connected to the basic etching mask, even when the final shape is produced and the silicon underneath the correction etching masking disappears, the opposite ends of the correction etching masks are still connected to the basic etching mask.

With the microstructure manufacturing method of the present embodiment, stress concentration to the recess of the correction etching mask can be reduced. Therefore, breakage of the correction etching mask can be more assuredly prevented.

Embodiment 3

Figure 5:
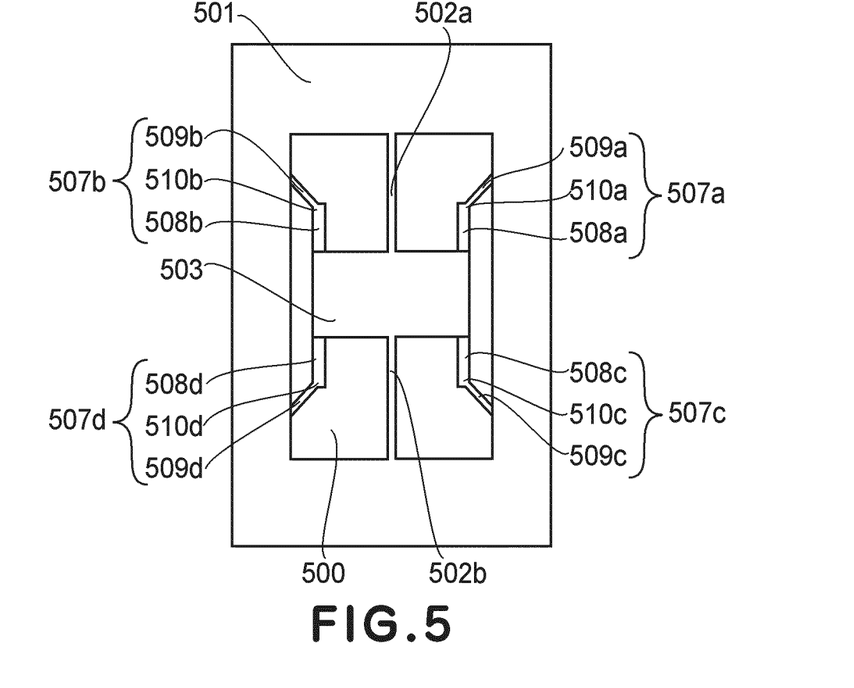
FIG. 5 is a top plan view for explaining an etching mask according to a third embodiment of the present invention.
Figure 6A:
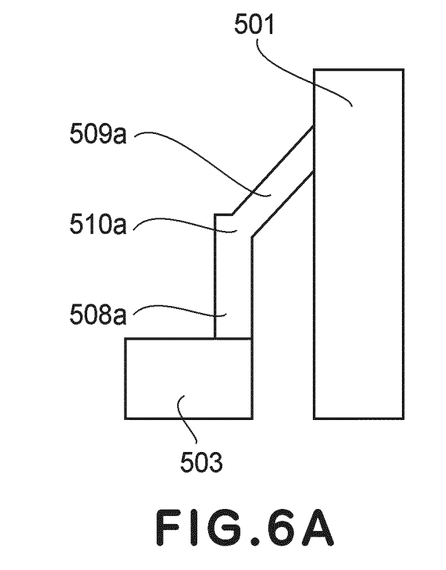
FIG. 6A is a top plan view for explaining a portion of a correction etching mask in the third embodiment of the present invention.
Figure 6B:
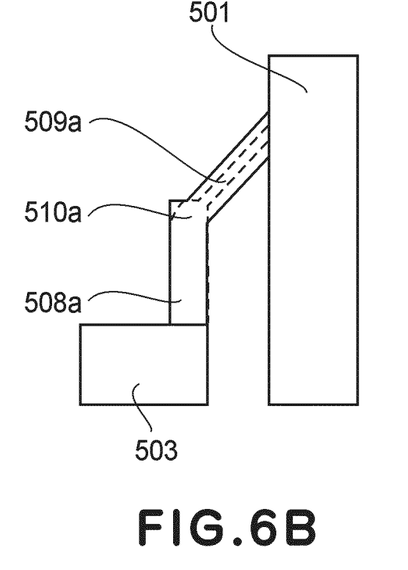
FIG. 6B is a top plan view for explaining an initial stage of the etching process in a portion of the correction etching mask.
Figure 6C:
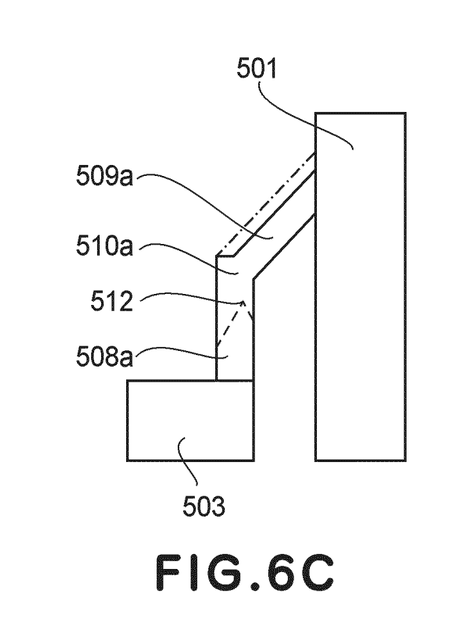
FIG. 6C is a top plan view for explaining a middle stage of the etching process in a portion of the correction etching mask.
Figure 6D:
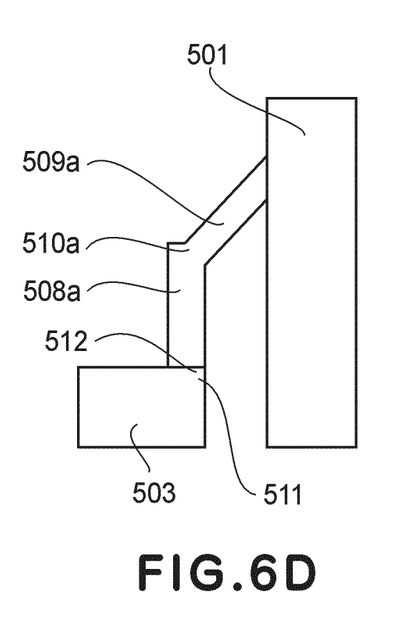
FIG. 6D is a top plan view for explaining a final stage of the etching process in a portion of the correction etching mask.
Figure 7:
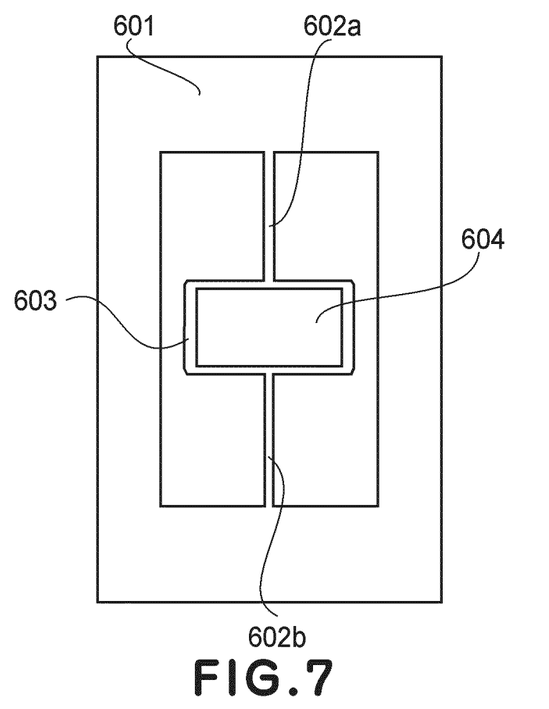
FIG. 7 is a top plan view of a micro-oscillator or an optical deflector according to the third embodiment of the present invention, which is made based on the microstructure manufacturing method of the present invention.

Referring to FIGS. 5, 6 and 7, a microstructure manufacturing method according to a third embodiment of the present invention will be explained.

FIG. 5 is a top plan view illustrating an etching mask for the microstructure of the present embodiment, and FIG. 6 is a top plan view for explaining a correction etching mask of the present embodiment. FIG. 7 is a top plan view of an optical deflector made in accordance with the microstructure manufacturing method of the present embodiment.

The micro-oscillator of the third embodiment has a generally similar structure to that of the optical deflector of the first embodiment.

In the microstructure manufacturing method of the present embodiment, the correction etching masks 507a, 507b, 507c, and 507d are connected to the movable member 503 and the supporting member 501, which are a basic etching mask. Furthermore, the correction etching mask portions 508a, 508b, 508c, and 508d are connected to the projecting corners of the basic etching mask 503 of the movable member and have a rectangular shape extending in the [110] direction. Furthermore, the correction etching mask portions 509a, 509b, 509c, and 509d, which extend diagonally relative to the [110] direction, are connected to the basic etching mask 501 of the supporting member.

As described above, the basic etching masks 501, 503, 502a, and 502b of the target shape having projecting corners and openings, which define these corners, as well as the correction etching masks, are formed on the monocrystal silicon substrate 500 having a (100) surface as the principal surface. The correction etching mask includes an end portion that extends through the opening of the aforementioned target shape and is connected to the projecting corner, and an end portion that is connected to a portion 501 of the basic etching mask corresponding to the above-described projecting corner.

Referring to FIGS. 6A-6D, which are partial views, respectively, of the structure shown in FIG. 6A, the basic etching mask 503 of the movable member and the basic etching mask 501 of the supporting member are formed on the monocrystal silicon substrate 500 having a (100) surface as a principal surface. Furthermore, the correction etching mask portions 508a and 509a are formed to connect the basic etching mask 503 of the movable member and the basic etching mask 501 of the supporting member.

When such silicon substrate 500 is dipped in an anisotropic wet etching solution, as shown in FIG. 6B, the etching progresses in the [100] direction perpendicular to the plane of the drawing and, in addition to this, the silicon mainly underneath the correction etching mask 509a is etched as well. Then, the protruded portion of the portion 508a is slightly etched (as depicted by a broken line). Then, as the etching progresses further, as shown in FIG. 6C, the silicon substrate underneath the portion 509a is etched, and the silicon underneath the correction etching mask portion 508a is etched. Here, the silicon free end portion 512 (as depicted by a broken line) underneath the correction etching mask portion 508a is in the outer circumferential direction of the movable member 503 (rightward in the sheet of the drawing). Finally, as shown in FIG. 6D, the silicon portion underneath the basic etching mask 503 of the movable member is left, whereby a final shape is produced.

In the final shape, side etching progresses while the silicon underneath the correction etching mask is completely etched, and the projecting corner is slightly etched (as depicted by a broken line). The side etching amount 511 is, however, very small since the silicon end portion 512 underneath the correction etching mask portion 508a is in the outer circumferential direction of the movable member 503 (rightward in the sheet of the drawing). Thus, a larger area of the movable member can be utilized.

In the etching process described above, the correction etching mask is connected to the basic etching mask. Therefore, even when the final shape is produced and the silicon underneath the correction etching masking is removed, the opposite ends of the correction etching mask are still connected to the basic etching mask. Thus, in the present embodiment, advantageous effects similar to those in the preceding embodiment are provided.

Furthermore, with the use of the correction etching mask described above, as shown in FIG. 7, the side etching amount at the projecting corner of the movable member 603 can be reduced. Therefore, the region available for the reflection surface 604 can be widened.

The optical deflector of the present embodiment also comprises a supporting member 601, a movable member 603 and resilient supporting members 602a and 602b. The resilient supporting members 602a and 602b connect the movable member 603 to the supporting member 601 resiliently around the torsion axis rotation.

In the present embodiment, a projecting corner having a right angle is formed at each of the bent portions 510a, 510b, 510c, and 510d of the correction etching masks. However, the bent portions may be such as depicted by a dash-and-dot line in FIG. 6C, where an obtuse-angle corner is formed. In that case, however, since the etching progresses so that the silicon free end portion 512 comes to a position slightly left of the illustrated position in FIG. 6C, the silicon free end portion 512 shown in FIG. 6D, which is underneath the correction etching mask 508a, comes to a position, which is slightly in the inward circumferential direction (left) of the movable member 503.

Embodiment 4

Figure 11:
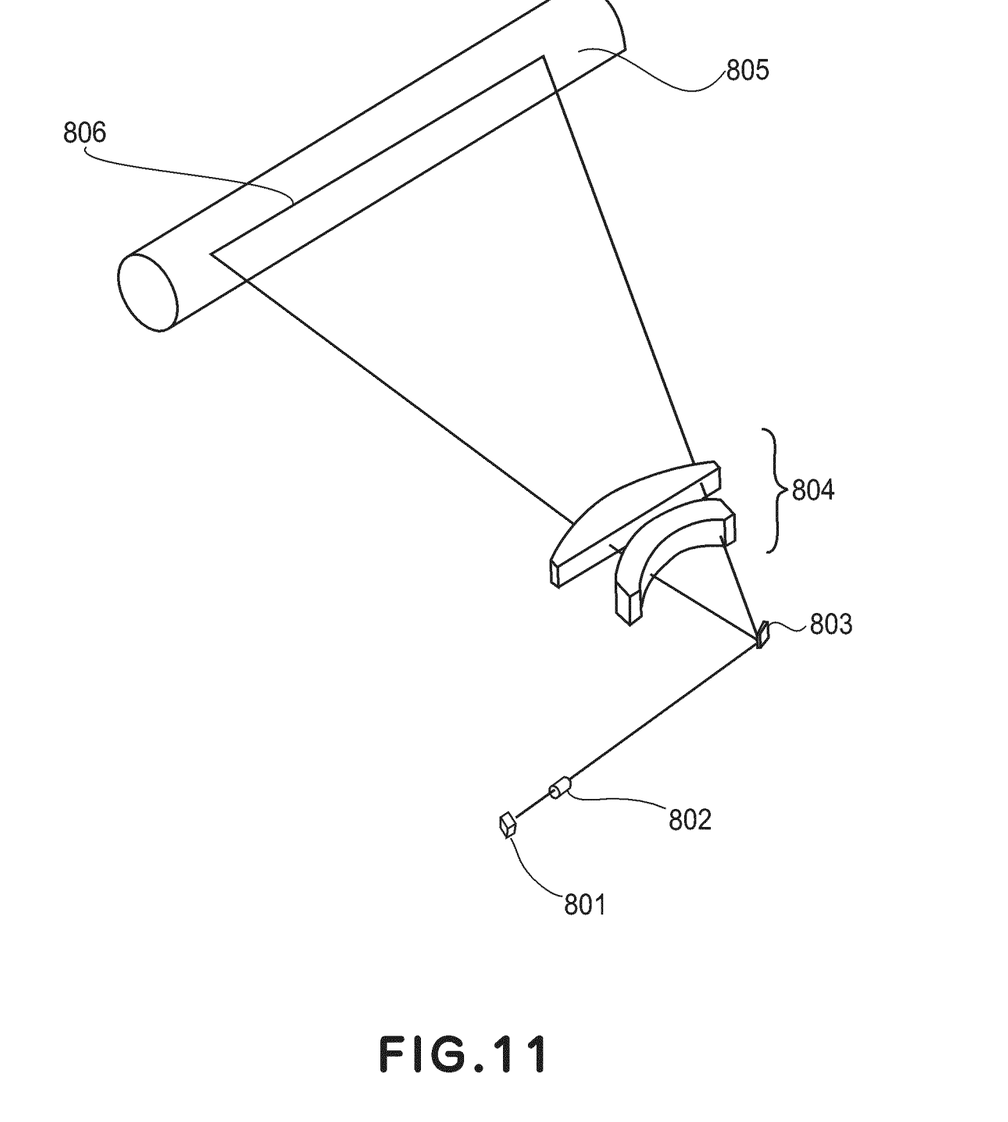
FIG. 11 is a perspective view for explaining an image forming apparatus according to the present invention.

FIG. 11 is a diagram showing an embodiment of an optical instrument using an optical deflector according to the present invention.

Here, an image forming apparatus is shown as the optical instrument. In FIG. 11, denoted at 803 is an optical deflector of the present invention, which is arranged, in the present embodiment, to scanningly deflect an incident light beam one-dimensionally. Denoted as 801 is a laser source. Denoted as 802 is a lens or lens group. Denoted as 804 is a writing lens or lens group. Denoted as 805 is a photosensitive member. Denoted as 806 is the locus of scan.

The laser beam projected from the laser source 801 undergoes a predetermined intensity modulation related to the timing of the scanning deflection of the light. The intensity-modulated light is scanningly deflected by the optical deflector 803. By the function of the writing lens or lens group 3004, the thus scanned laser beam forms an image on the photosensitive member 805.

The photosensitive member 805 is uniformly electrically charged by a charging device (not shown). Thus, when it is scanned with light, an electrostatic latent image is formed on the scanned portion. Subsequently, a toner image is formed on the image portion of the electrostatic latent image by means of a developing device (not shown). This toner image is transferred to a paper sheet (not shown) and fixed thereon, forming an image on the paper sheet.

Since the image forming apparatus uses an optical deflector of the present invention, which can be manufactured with a lower deficient product rate, the image forming apparatus can be provided relatively inexpensively.

The optical deflector of the present invention can be used for any other optical instrument and can serve in such an instrument to deflectively reflect a light beam from a light source and to make at least a portion of the light beam incident on an object to be irradiated. Examples of such optical instruments are an image forming apparatus, such as a laser beam printer, and, in addition to this, a picture display unit and a mechanical device, such as, for example, a bar code reader, wherein a light beam is scanned.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2007-298175, filed Nov. 16, 2007, which is hereby incorporated herein by reference.

What is claimed is:

1. A method of manufacturing a structure, comprising:
a first step of forming, on a monocrystal silicon substrate having a (100) surface as a principal surface, a first mask pattern corresponding to a target shape having at least a first configuration with a corner and a second configuration adjoining the first configuration with an opening therebetween, and a second mask pattern extending from a portion of the first mask pattern corresponding to the first configuration and connected to a portion of the first mask pattern corresponding to the second configuration, wherein the corner of the first configuration is formed by a line extending in a [110] direction and a line extending in a [1-10] direction, and the second configuration has a side formed by a line extending in the [110] direction, wherein the second mask pattern has an extension extending in the [1-10] direction from a portion corresponding to a corner of the first configuration and a bent portion branched or bent from the extension, and wherein the second mask is connected with a side, extending in the [110] direction, of a portion of the first mask corresponding to the second configuration; and
a second step of performing anisotropic etching to the monocrystal silicon substrate having the first mask pattern and the second mask pattern, to form the target shape.

2. A method according to claim 1, wherein said second step includes a step of removing a portion of the monocrystal silicon substrate where the second mask pattern is formed.

3. A method according to claim 1, wherein the second mask pattern has a bent portion.

4. A method according to claim 1, wherein the second mask pattern has at least a shape extending in the [1-10] direction.

5. A method according to claim 1, wherein the second mask pattern has at least a shape extending in a [100] direction.

6. A method according to claim 1, wherein the second mask pattern has a Y-letter shape extending from the corner of the first configuration in the [1-10] direction and branched off in a [100] direction, the branches of the second mask pattern being connected to the second configuration of the first mask pattern.

7. A method according to claim 1, wherein the second mask pattern has a recess having a curvature.

* * * * *